(12) United States Patent
Krymski (10) Patent No.: US 6,184,721 B1
(45) Date of Patent: Feb. 6, 2001

(54) CMOS VOLTAGE COMPARATOR CAPABLE OF OPERATING WITH SMALL INPUT VOLTAGE DIFFERENCE

(75) Inventor: Alexander I. Krymski, Montrose, CA (US)

(73) Assignee: Photobit Corporation, Pasadena, CA (US)

( * ) Notice: Under 35 U.S.C. 154(b), the term of this patent shall be extended for 0 days.

(21) Appl. No.: 09/283,659

(22) Filed: Apr. 1, 1999

Related U.S. Application Data (60) Provisional application No. 60/080,497, filed on Apr. 2, 1998.

(51) Int. Cl.[7] .............................. H03K 5/153; H03F 3/45
(52) U.S. Cl. ................. 327/52; 327/55; 327/563
(58) Field of Search ..................... 327/50, 52, 55, 327/94, 91, 96, 563

(56) References Cited

U.S. PATENT DOCUMENTS 5,274,275 * 12/1993 Colles ....................................... 327/52
6,018,260 * 1/2000 Gabara ..................................... 327/55

* cited by examiner

*Primary Examiner*—Dinh T. Le
(74) *Attorney, Agent, or Firm*—Fish & Richardson P.C.

(57) ABSTRACT

A circuit for use in comparing input voltages includes switching elements initially configured in a reset mode to minimize charge or current conduction before entering a comparison mode. A strobe signal reconfigures the switching elements to transition from the reset mode to the comparison mode. Finally, a determination is made as to which of the input voltages is larger or smaller.

17 Claims, 6 Drawing Sheets

CMOS VOLTAGE COMPARATOR CAPABLE OF OPERATING WITH SMALL INPUT VOLTAGE DIFFERENCE

CROSS-REFERENCE TO RELATED APPLICATION

This application claims benefit of the priority of U.S. Provisional Application Ser. No. 60/080,497, filed Apr. 2, 1998 and entitled "Strobed CMOS Comparator".

BACKGROUND

This specification generally relates to voltage comparators. More specifically, the present specification describes method and apparatus for comparing input voltages having a small voltage difference.

Voltage comparators determine which of the two input voltages are larger or smaller. Since a voltage comparator often senses small differences between the input voltages and generates a digital output, a large amplification may be needed. The large amplification necessary for sensing small differences is constructed using a differential amplifier operating in a non-linear region. The differential amplifier has two transistors connected as a source-coupled pair with one of the transistors turned-off and the other transistor turned-on. Therefore, the amplifier has one transistor turned-on and drawing current even under static condition when the transistors are in a stable non-switching state.

As amplification circuits, comparators are susceptible to influence of noise on the input voltages. The noise on the input voltages causes erratic switching and false triggering of the comparator output. Thus, positive feedback can be applied to reduce the influence of noise on the comparison and to increase the flexibility of the differential threshold of switching. The flexibility of the threshold is increased by making the threshold less sensitive to the difference in input voltages and more sensitive to the previous levels of the input voltages. However, the feedback also tends to slow the response of the comparator and limits the lowest differential voltage which can be sensed.

The voltage comparators are used in various different applications such as in analog-to-digital converters (ADCs), signal generators, and image arrays and ADCs of complementary metal-oxide semiconductor (CMOS) active pixel sensors (APSs).

The voltage comparators used in the CMOS APSs are sensitive to a high fixed-pattern noise. The fixed-pattern noise is an unvarying display pattern resulting from the difficulty in exactly matching transistor thresholds on CMOS circuits for photocurrent amplification and transfer circuitry.

SUMMARY

The inventor noticed that by placing switches across the source-drain terminals of the cross-coupled load transistors and closing the switches during the reset mode, the load transistors are disabled. This prevents any charge or current conduction through the load transistors during the reset mode and effectively reduces the adverse effect of the load transistor threshold mismatch during the comparison mode.

In addition, this technique produces much smaller input-referred offset with a desired effect of much less erroneous comparison.

In one aspect, the present disclosure compares input voltages that are relatively close to each other. Initially, switching elements are configured in a reset mode to prevent any charge or current conduction. A strobe signal reconfigures the switching elements to transition from the reset mode to the comparison mode. Finally, a determination is made as to which of the input voltages is larger or smaller.

In some embodiments, an output result of the comparison is a positive number if a first input voltage is larger than a second input voltage, and a negative number if the second input voltage is larger than the first input voltage. In further embodiments, the output result is correctly determined with magnitude of an input voltage difference as small as 1.5 mV.

In other embodiments, the input voltages are sampled for comparison to prevent input voltages from changing for the duration of the comparison. In further embodiments, the output result of the comparison is buffered.

In another aspect, the disclosure features a CMOS active pixel image sensor system for use in detecting images through photocurrent picked up by an image pixel array. The system also includes an analog-to-digital converter which includes the improved voltage comparators.

In yet another aspect, the disclosure features a CMOS APS camera system for use in detecting and displaying images. This system also includes the improved voltage comparators.

Among the advantages of the present disclosure is the small input-referred offset. As a result, input voltages of small difference can be compared accurately.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1A:
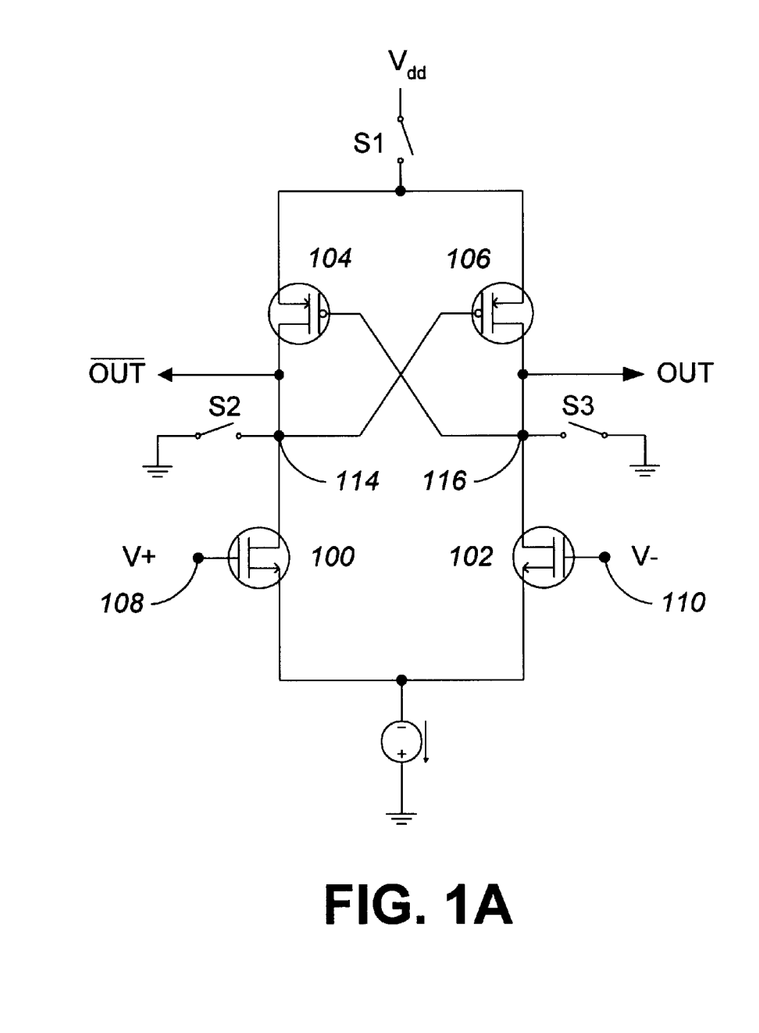
FIG. 1A is a schematic diagram of a CMOS voltage comparator.

FIG. 1A shows a schematic diagram of a voltage comparator. Since input voltages 108, 110 can change rapidly and at different rates, comparator outputs 114, 116 are disabled until some predetermined time after the input voltages are stabilized. Switches S1 through S3 are used to disable the output and to turn-off load transistors 104, 106. The switches are controlled by a strobe signal.

In a reset mode, i.e. before comparison, the switch S1 is open and the switches S2 and S3 are closed. This prevents the current from flowing through p-channel metal-oxide semiconductor (PMOS) load transistors 104, 106. However, the PMOS transistors 104, 106 are on and conducting because the gate terminals of the PMOS transistors are tied to a ground voltage by the switches S2 and S3.

In a comparison mode, the strobe signal turns the switch S1 closed and the switches S2 and S3 open. This configuration starts the comparison of the two input voltages 108, 110. If the input voltage at input node 108 is higher than the input voltage at input node 110, an n-channel metal-oxide semiconductor (NMOS) input transistor 100 turns on more than the other NMOS input transistor 102. This pulls the node 114 to a lower voltage than the voltage at the node 116. The lower voltage on the node 114 turns PMOS transistor 106 on and brings the node 116 higher up toward Vdd. Thus, the comparator output at node 116 indicates that the voltage difference is positive.

However, when the input voltage difference is small, the voltage at the comparator output can depend on which load transistor reacts faster and conducts more efficiently rather than on the value of the voltage difference. The output of the comparator becomes particularly sensitive to the load mis-matching in the load transistors because the positive feedback of the cross-coupled pair 104, 106 multiplies the mismatch and destabilizes the comparison.

Figure 1B:
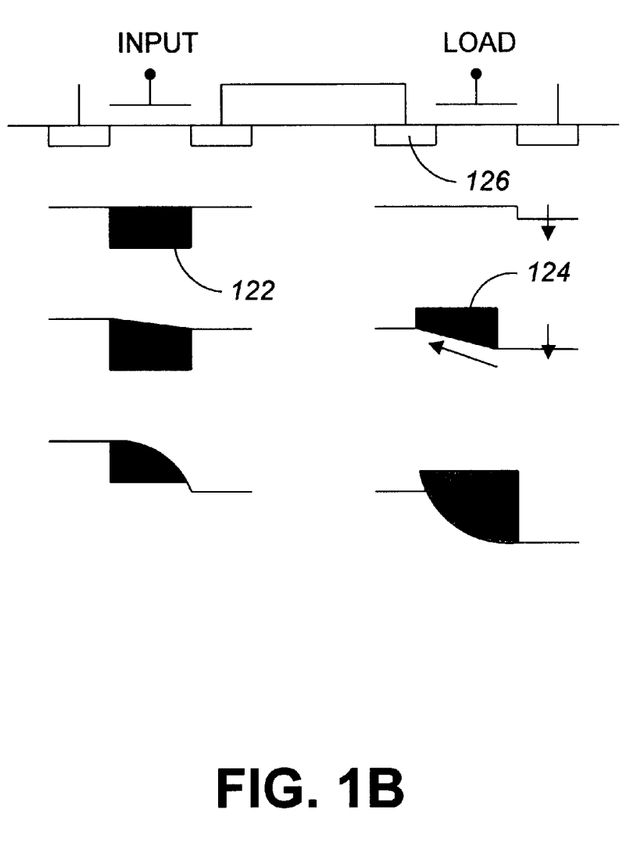
FIG. 1B is charge-surface potential diagrams of an input-load transistor pair at the initial stage of the comparison.

FIG. 1B illustrates the above mentioned issue when the input voltage difference is small. The figure shows charge-surface potential diagrams at the initial stage of the comparison for one of the input-load transistor pair. Charges 122 build up on the input transistor because the transistors were conducting prior to the comparison. Once the comparison starts, the charges keep the input transistor in a linear region and prevent the input transistor from having a strong dependence on the input gate voltage. This allows the current through the load transistor to quickly charge up 124 the common-drain terminal 126. This reset configuration allows a load transistor with higher conductivity to take control of the common-drain terminal 124 by charge injection when the input voltage difference is small. Therefore, even a slight mismatch in the thresholds of the load transistors results in a large input-referred offset (i.e. the smallest input voltage difference necessary to achieve a correct comparator output) or an erroneous comparator output.

The present disclosure describes a strobed CMOS voltage comparator capable of operating with a small input voltage difference. This circuit operates by completely disabling the load transistors prior to the voltage comparison. During a reset mode, the load transistors are prevented from any charge conduction to reduce the effect of threshold mismatch in the load transistors on the comparator output during a comparison mode.

Figure 2A:
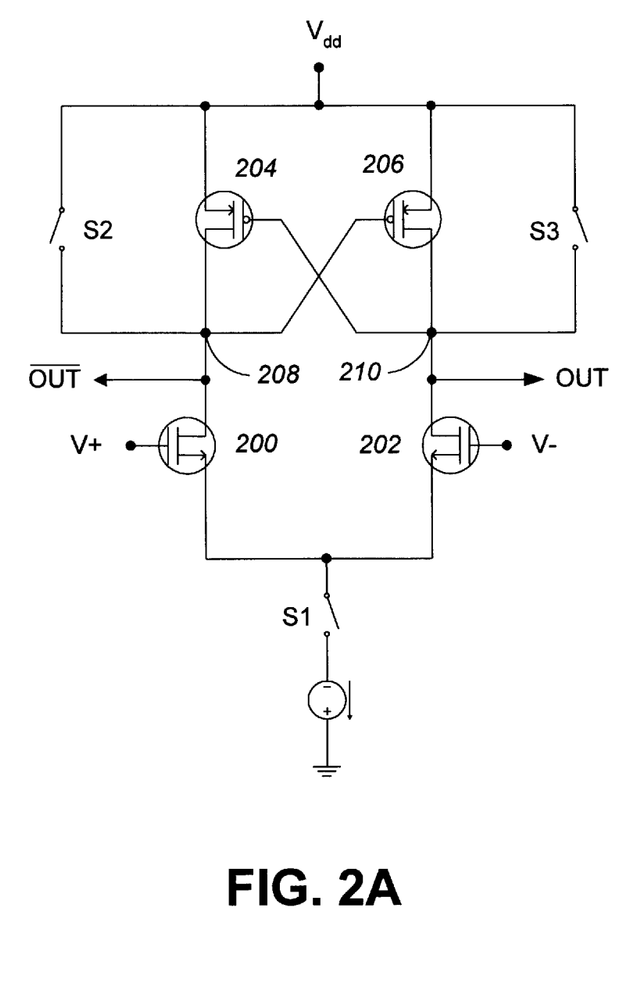
FIG. 2A is a schematic diagram of the improved CMOS voltage comparator.

FIG. 2A show a schematic diagram of the improved CMOS voltage comparator with above described advantages. Switches for the strobe signal are connected to minimize the effects from the characteristics of the individual components. This makes the comparison between the input voltages much more fair than the conventional comparator (i.e. based more on the input voltages).

In the reset mode, the switch S1 is open and the switches S2 and S3 are closed. Both the source and the drain terminals of the load transistors 204, 206 are tied to a supply voltage Vdd, when the strobe signal closes the switches S2 and S3. This prevents any charge or current from conducting through the PMOS transistors 204, 206.

The strobe signal sends a pulse to close the switch S1 and open the switches S2 and S3 to enter the comparison mode. This configuration allows the voltage at the gate terminal of the input transistor to control the amount of current filling up the wells in the load transistors. Even a slightly higher input voltage at the gate terminal of one of the input transistors pulls a common drain node 208 or 210 lower toward a ground voltage. The load transistor that fills up its well first brings the common-drain node 208 or 210 higher up toward the supply voltage, Vdd, and prevents the other load transistor from further current conduction.

The output current has a strong dependence on the input voltages at the gate terminals of the NMOS transistors 200, 202. The output of the comparator is less sensitive to the threshold mismatch of the load transistors. The multiplication of the mismatch for the improved comparator is significantly reduced in the feedback of the cross-coupled pair 204, 206 than for the conventional comparator. Therefore, the voltage comparison is more stable and fair.

Figure 2B:
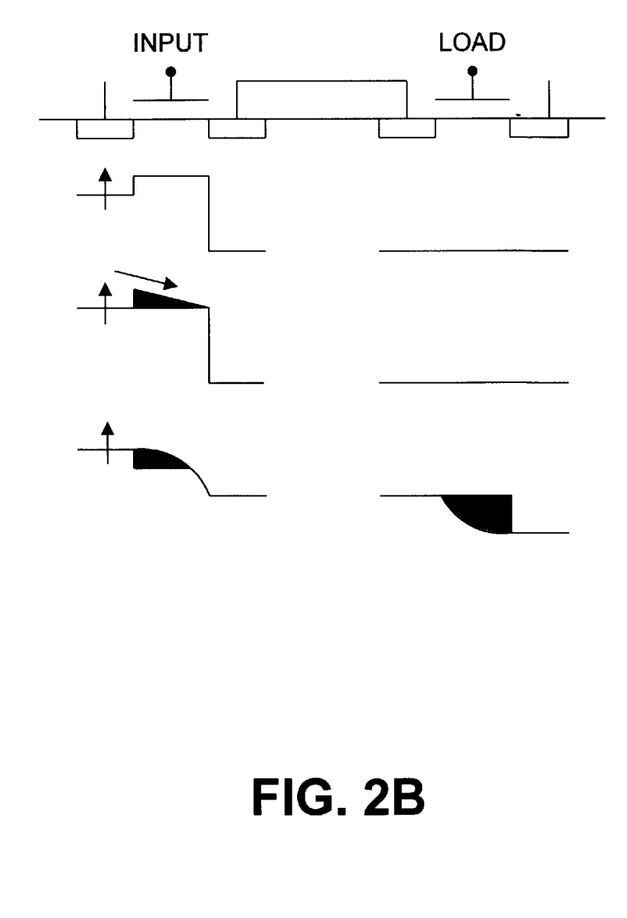
FIG. 2B is charge-surface potential diagrams of an input-load transistor pair of the improved CMOS voltage comparator at the initial stage of the comparison.

FIG. 2B shows the charge-surface potential diagrams at the initial stage of the comparison for one of the two input-load transistor pairs of the improved comparator. The input transistor is initially in a sub-threshold state characterized by high sensitivity to the input voltage at the gate terminal. Unlike the conventional comparator, there is no built-up charge on the input transistor due to charge conduction.

When the strobe signal indicates the start of the comparison mode, an input transistor with a lower barrier (i.e. higher input voltage at the gate terminal) sinks more current through the load and fills its drain-well before the other input transistor. The charge-surface potential of the load transistor stays static until the internal potential exceeds the PMOS threshold voltage. Therefore, any threshold mismatch between the load transistors has significantly less effect on the output of the comparator than it would in the conventional comparator.

Figure 3:
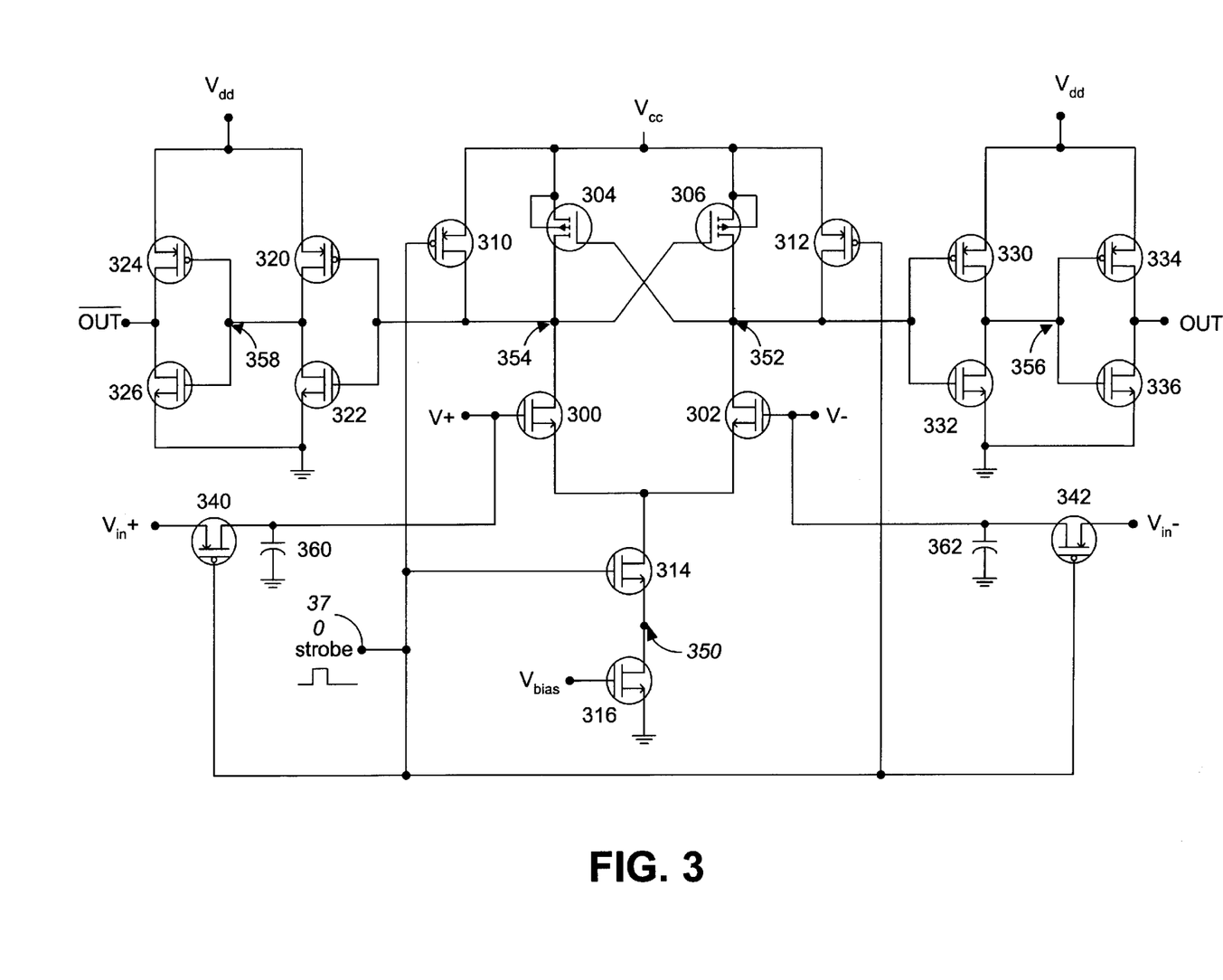
FIG. 3 is a detailed schematic diagram of one implementation of the present invention.

FIG. 3 shows an implementation of the improved voltage comparator shown in FIG. 2A. The switch S1 is implemented with an NMOS transistor 314. The switches S2 and S3 are implemented with PMOS transistors 310, 312.

In the reset mode, the strobe signal 370 is disabled and applies a low voltage at the gate terminals of the PMOS transistors 310, 312 and the NMOS transistor 314. The low voltage at the gate terminals of the PMOS transistors 310, 312 turns on those transistors. The low voltage at the gate terminal of the NMOS transistor 314 turns off that transistor because the source terminal node 350 is biased at a higher voltage than the low voltage at the gate terminal. The node 350 is biased to some voltage above the ground voltage by an NMOS transistor 316 which is always turned on by a bias voltage at the gate terminal. In this configuration, there is no current or charge flowing through load transistors 304, 306 into input transistors 300, 302.

The strobe signal 370 is enabled by a pulse of some predetermined time duration. The input voltages, $V_{in}+$ and $V_{in}-$, are compared during this time duration. The strobe pulse 370 turns off transistors 310, 312 and turn on transistor 314 to allow current to flow through the load transistors 304, 306 into the input transistors 300, 302. The strobe pulse 370 also cuts off PMOS pass-through transistors 340, 342 to prevent the input voltages from changing during the time duration of the comparison.

The input voltages, V+ and V−, sampled by capacitors 360, 362, respectively, drive the NMOS input transistors 300, 302 during the comparison mode. If the voltage at the V+ input is higher, the channel of the input transistor 300 is opened wider and the node 354 is driven lower than the node 352. This immediately turns on the PMOS load transistor 306 and drives node 352 to a logic high, which turns off the PMOS load transistor 304. Therefore, the node 352 enters a stable logic high state indicating a positive input voltage difference.

A transistor pair 330, 332 operates as an inverter. A logic high at the node 352 turns off PMOS transistor 330 and turns on NMOS transistor 332. This pulls down the node 356 to a logic low. A transistor pair 334, 336 is another inverter. A logic low at the node 356 turns on PMOS transistor 334 and turns off NMOS transistor 336. This pulls the output node, OUT, to a logic high and the output node follows the node 352. Therefore, the transistors 330 through 336 act as a buffer. The transistors 320 through 326 act as a buffer for the other output node, $\overline{\text{OUT}}$.

Figure 4:
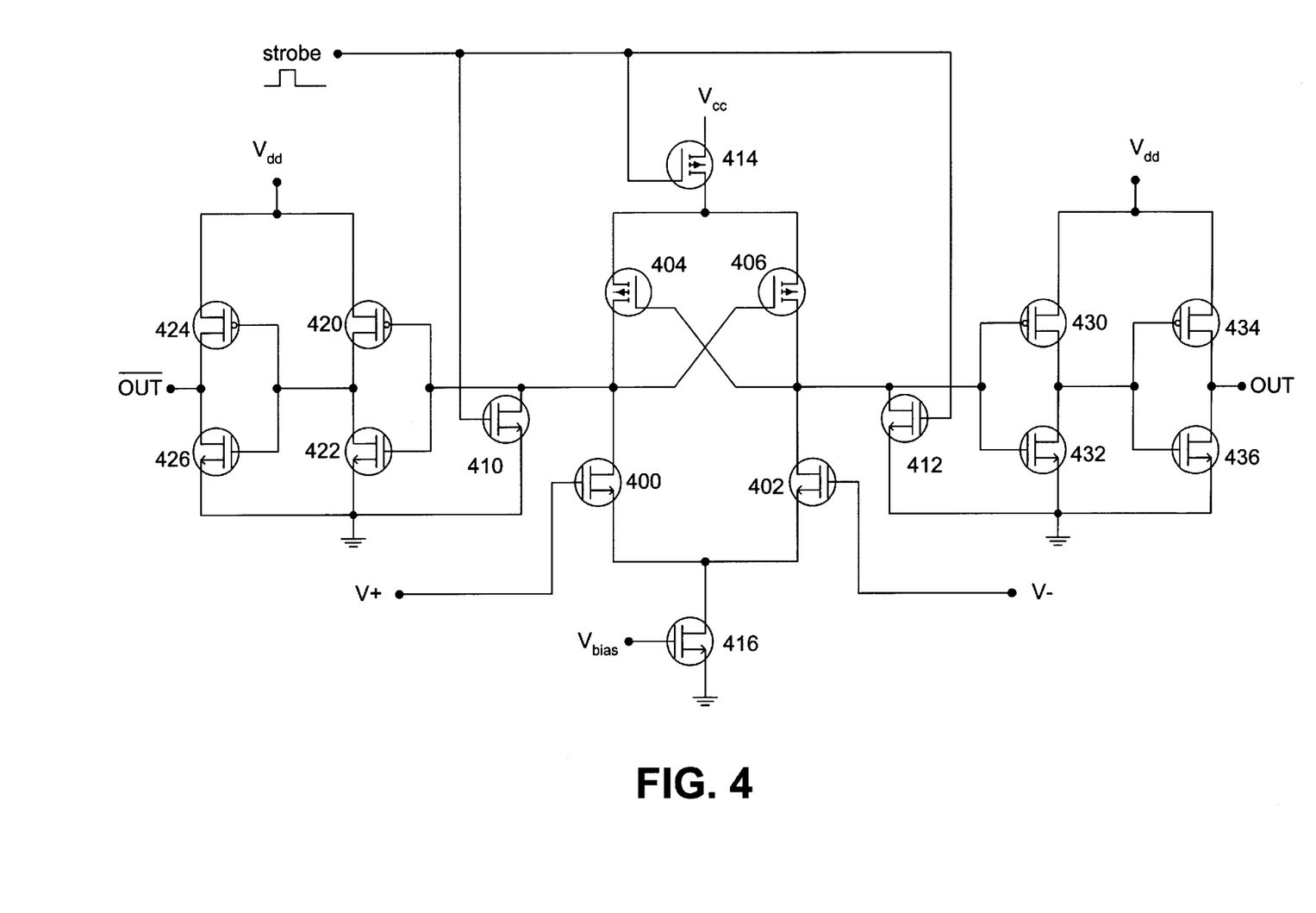
FIG. 4 is one implementation of the conventional voltage comparator.

FIG. 4 shows one implementation of the conventional voltage comparator shown in FIG. 1A. Transistors 414, 410, 412 implement switches S1, S2, and S3, respectively. NMOS transistors 400, 402 are input transistors operating to compare input voltages at V+ and V− nodes. PMOS transistors 404, 406 are cross-coupled load transistors. Transistors 430 through 436 and 420 through 426 are buffers for output nodes, OUT and $\overline{\text{OUT}}$, respectively.

Figure 5A:
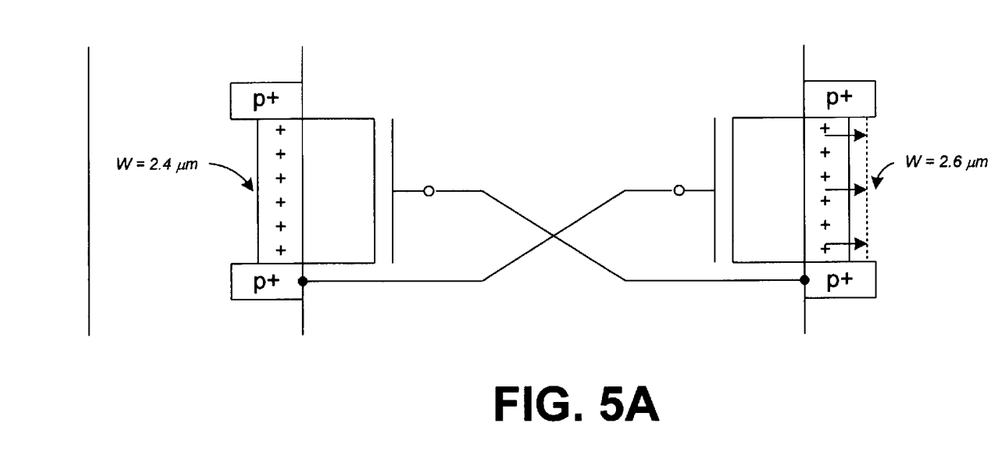
FIG. 5A illustrates an insertion of a 10% mismatch in the thresholds of the load transistors.
Figure 5B:
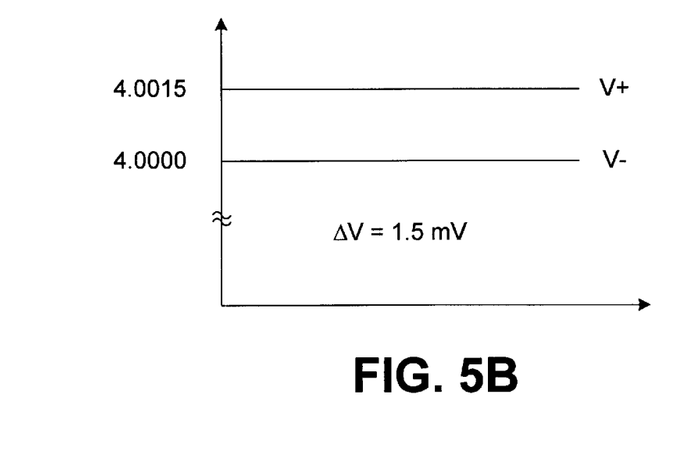
FIG. 5B is an input-referred offset, ΔV, for the improved comparator resulting from the 10% mismatch.
Figure 5C:
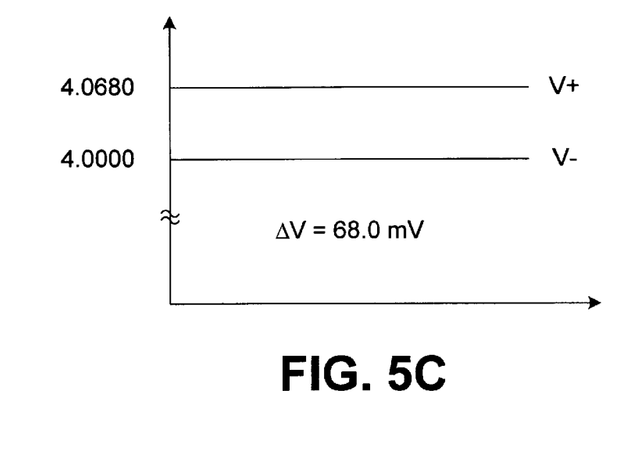
FIG. 5C is the input-referred offset for the conventional comparator resulting from the 10% mismatch.

FIGS. 5A through 5C illustrate the advantages of the improved CMOS voltage comparator shown in FIG. 3 over the conventional CMOS voltage comparator shown in FIG. 4.

FIG. 5A shows a deliberate insertion of a slight mismatch in the load transistors. The mismatch is inserted by varying the channel width by 10% in only one of the two load transistors. This results in the channel width of the load transistor 304 or 404 to be 2.4 $\mu$m and the other load transistor 306 or 406 to be 2.6 $\mu$m.

FIG. 5B shows an input-referred offset, $\Delta V$, for the improved comparator. The input-referred offset is a smallest input voltage difference necessary to achieve a correct comparator output. FIG. 5C shows the input-referred offset for the conventional comparator. The V− input voltage is held constant at 4.0 volts for both cases.

The improved comparator output breaks down at V+ input voltage of 4.0015 volts while the conventional comparator output breaks down at V+ input voltage of 4.0680 volts. Therefore, the improved comparator shows the significantly advantageous lower input-referred offset of 1.5 mV, versus 68.0 mV for the conventional comparator.

Figure 6A:
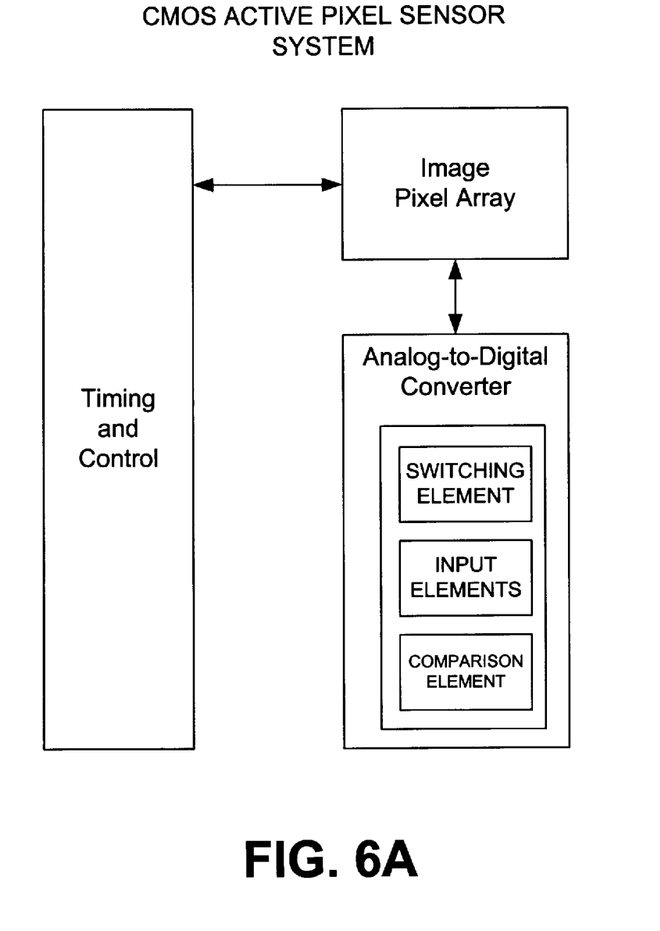
FIG. 6A is a block diagram of a CMOS image sensor system.
Figure 6B:
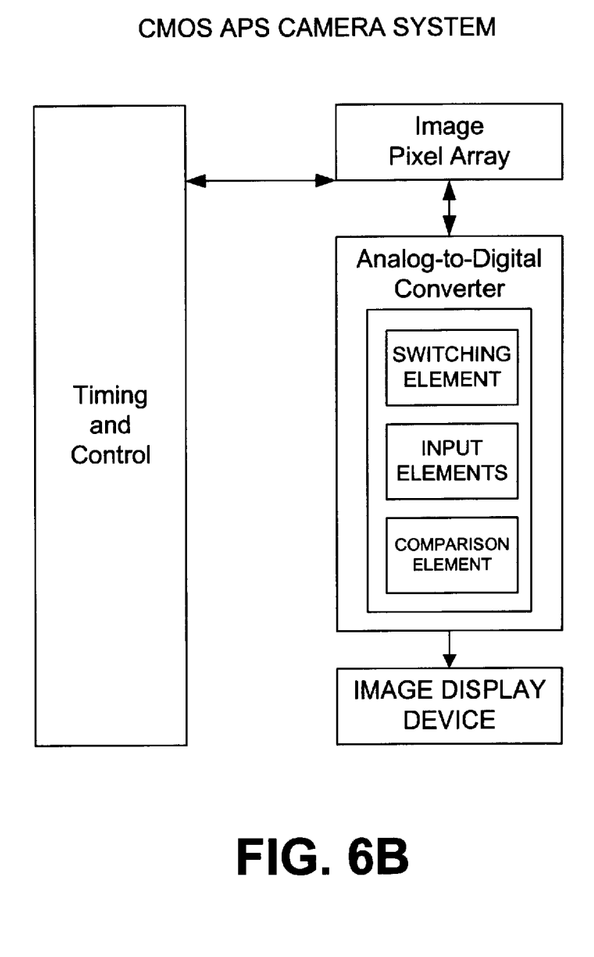
FIG. 6B is a block diagram of a CMOS image sensor camera system.

FIGS. 6A and 6B show block diagrams of a CMOS image sensor system and a CMOS image sensor camera system. The sensor system and the camera system are two examples among the systems that may include the improved voltage comparator described above.

A number of embodiments of the present invention have been described. Nevertheless, it will be understood that various modifications may be made without departing from the spirit and scope of the invention. For example, the switch may be implemented in various ways, such as with one or more transistors, a digital logic array, or a programmed microprocessor. Accordingly, other embodiments are within the scope of the following claims.

What is claimed is:

1. A voltage comparator circuit comprising:
   a pair of switching elements;
   a first input element that receives input voltages for comparison;
   a second input element that receives a strobe signal that indicates a transition from a reset mode to a comparison mode; and
   a comparison element coupled to the first and second input elements to receive the input voltages and configured to determine which of the input voltages is larger, said comparison element including:
      a pair of source-coupled input transistors configured to draw current from a supply voltage, the current being proportional to the input voltages applied at the gate terminals of the input transistors, and
      a pair of cross-coupled load transistors configured to pass the current drawn by the input transistors, where more current is passed by the load transistor whose gate terminal is drawn by the input transistor with higher input voltage,
   where each of said pair of switching elements are arranged across source and drain terminals of each of said pair of cross-coupled load transistors to prevent any charge or current conduction through the load transistors during the reset mode, which reduces threshold mismatch in the load transistors during the comparison mode.

2. The circuit of claim 1, wherein an output result of the comparison element is a positive value when first input voltage is larger than a second input voltage, and a negative value when the second input voltage is larger than the first input voltage.

3. The circuit of claim 1, wherein the input transistors are depletion mode NMOS transistors and the load transistors are enhancement mode PMOS transistors.

4. The circuit of claim 1, wherein the switching elements include:
   a pair of PMOS transistors, each PMOS transistor connected across the source-drain terminals of one of the pair of load transistors;
   a first NMOS transistor connected from common-source terminal of the input transistors to a bias node; and
   a second NMOS transistor connected from the bias node to a ground terminal, the second NMOS transistor always biased on, where the bias node is biased to a voltage above a ground voltage, such that the bias node allows the first NMOS transistor to be switched by a strobe signal.

5. The circuit of claim 4, wherein the strobe signal turns on the pair of PMOS transistors and turns off the first NMOS transistor during the reset mode, and turns off the pair of PMOS transistors and turns on the first NMOS transistor during the comparison mode.

6. The circuit of claim 1, further comprising a sampling element configured to sample the input voltages for comparison, the sampling element preventing the input voltages from changing during comparison.

7. The circuit of claim 6, wherein the sampling element includes:
   a pair of PMOS transistors coupled to the first and second input elements, said pair of PMOS transistors operating to prevent the input voltages from reaching the comparison element during the comparison mode; and
   a pair of capacitors configured to hold the input voltages at a specified level for the duration of the comparison mode.

8. The circuit of claim 1, further comprising a buffering element to buffer output result of the comparison element.

9. The circuit of claim 8, wherein the buffering element includes two cascaded stages of inverters, where each inverter has a PMOS and an NMOS transistors connected in common-drain and common-gate configuration.

10. A method for comparing input voltages having a small difference, the method comprising:
receiving a first input voltage and a second input voltage for comparison;
receiving a strobe signal that indicates a transition between a reset mode and a comparison mode;
providing a comparison element to allow the strobe signal to operate to prevent load transistors from any charge conduction during the reset mode, which reduces threshold mismatch in the load transistors during the comparison mode; and
determining which of the first and second input voltages is larger.

11. The method of claim 10, wherein the output result is a positive value when the first input voltage is larger than the second input voltage, and a negative value when the second input voltage is larger than the first input voltage.

12. The method of claim 10, further comprising buffering the output result.

13. A voltage comparator circuit having a reset mode and a comparison mode, the circuit comprising:
a power supply configured to supply a supply voltage and a ground voltage;
a common-source differential amplifier having a pair of input transistors configured to receive a first input voltage and a second input voltage applied at a gate terminal of each input transistor, the pair of input transistors operating to draw current from the supply voltage that is proportional to the input voltages;
a pair of cross-coupled load transistors operating as loads for the input transistors and passing current to the common-drain node, where more current is passed by a load transistor whose gate terminal is drawn by the input transistor with higher input voltage;
a pair of switches, each connected across source and drain terminals of each of said pair of cross-coupled load transistors, where said pair of switches operates to prevent any charge or current conduction through the load transistors during the reset mode, which reduces threshold mismatch in the load transistors during the comparison mode; and
a third switch connected from the common-source terminal of the input transistors to the ground voltage.

14. The circuit of claim 13, wherein the pair of switches are closed and the third switch is opened during the reset mode.

15. The circuit of claim 13, wherein the input transistors are NMOS transistors and the load transistors are PMOS transistors.

16. A CMOS active pixel image sensor system comprising:
an image pixel array;
a timing and control element coupled to the image pixel array to control processing of photo-detector data; and
an analog to digital converter coupled to the image pixel array and including a voltage comparator circuit including:
a pair of switching elements;
a first input element that receives input voltages for comparison;
a second input element that receives a strobe signal that indicates a transition from a reset mode to a comparison mode; and
a comparison element coupled to the first and second input elements to receive the input voltages and configured to determine which of the input voltages is larger, said comparison element including:
a pair of source-coupled input transistors configured to draw current from a supply voltage, the current being proportional to the input voltages applied at the gate terminals of the input transistors, and
a pair of cross-coupled load transistors configured to pass the current drawn by the input transistors, where more current is passed by the load transistor whose gate terminal is drawn by the input transistor with higher input voltage,
where each of said pair of switching elements are arranged across source and drain terminals of each of said pair of cross-coupled load transistors to prevent any charge or current conduction through the load transistors during the reset mode, which reduces threshold mismatch in the load transistors during the comparison mode.

17. A CMOS image sensor camera system comprising:
an image pixel array;
a timing and control element coupled to the image pixel array to control processing of photo-detector data;
an analog-to-digital converter coupled to the image pixel array and including a voltage comparator circuit including:
a pair of switching elements;
a first input element that receives input voltages for comparison;
a second input element that receives a strobe signal that indicates a transition from a reset mode to a comparison mode; and
a comparison element coupled to the first and second input elements to receive the input voltages and configured to determine which of the input voltages is larger, said comparison element including:
a pair of source-coupled input transistors configured to draw current from a supply voltage, the current being proportional to the input voltages applied at the gate terminals of the input transistors, and
a pair of cross-coupled load transistors configured to pass the current drawn by the input transistors, where more current is passed by the load transistor whose gate terminal is drawn by the input transistor with higher input voltage,
where each of said pair of switching elements are arranged across source and drain terminals of each of said pair of cross-coupled load transistors to prevent any charge or current conduction through the load transistors during the reset mode, which reduces threshold mismatch in the load transistors during the comparison mode;
an image display device configured to receive a digitized image from the analog-to-digital converter and display the image on the image display device.

* * * * *

UNITED STATES PATENT AND TRADEMARK OFFICE
CERTIFICATE OF CORRECTION

PATENT NO. : 6,184,721 B1
DATED : February 6, 2001
INVENTOR(S) : Alexander I. Krymski It is certified that error appears in the above-identified patent and that said Letters Patent is hereby corrected as shown below:

Column 6,
Line 27, please replace "when first" with -- when a first --.

Column 7,
Line 3, please replace "transistors" with -- transistor --.

Signed and Sealed this

Seventh Day of May, 2002

*Attest:*

*Attesting Officer*

JAMES E. ROGAN
*Director of the United States Patent and Trademark Office*